United States Patent [19]

Rode et al.

[11] Patent Number: 4,987,055

[45] Date of Patent: * Jan. 22, 1991

[54] PHOTOPOLYMERIZABLE COMPOSITION COMPRISING (METH)ACRYLATES WITH PHOTOOXIDIZABLE GROUPS, AND A RECORDING MATERIAL PRODUCED THEREFROM

[75] Inventors: Klaus Rode, Wiesbaden; Dieter Mohr, Budenheim; Werner Frass, Wiesbaden-Naurod; Joachim Gersdorf, Wiesbaden, all of Fed. Rep. of Germany

[73] Assignee: Hoechst Aktiengesellschaft, Frankfurt am Main, Fed. Rep. of Germany

[*] Notice: The portion of the term of this patent subsequent to Jan. 8, 2008 has been disclaimed.

[21] Appl. No.: 287,276

[22] Filed: Dec. 21, 1988

[30] Foreign Application Priority Data

Dec. 22, 1987 [DE] Fed. Rep. of Germany ....... 3743547

[51] Int. Cl.$^5$ ............................................. G03F 7/032
[52] U.S. Cl. ................................... 430/277; 430/271; 430/275; 430/278; 430/279; 430/281; 430/283; 430/286; 430/287; 430/914; 430/915; 522/25; 522/26; 522/53; 522/63; 522/75
[58] Field of Search ............... 430/281, 283, 284, 286, 430/287, 271, 275, 277, 278, 279, 914, 915; 522/25, 26, 95, 53, 63

[56] References Cited

U.S. PATENT DOCUMENTS

| | | | |
|---|---|---|---|
| 3,097,096 | 7/1963 | Oster ....................................... | 96/30 |
| 3,488,269 | 1/1970 | Allen et al. ...................... | 204/159.23 |
| 3,597,343 | 8/1971 | Delzenne et al. ............... | 204/159.23 |
| 3,751,259 | 8/1973 | Bauer et al. .......................... | 96/115 |
| 3,759,807 | 9/1973 | Osborn et al. ................... | 204/159.23 |
| 3,782,961 | 1/1974 | Takahashi et al. ................ | 96/115 R |
| 3,850,770 | 11/1974 | Juna et al. ....................... | 204/159.19 |
| 3,960,572 | 6/1976 | Ibata et al. ........................ | 96/115 P |
| 4,019,972 | 4/1977 | Faust ................................. | 204/159.15 |
| 4,054,682 | 10/1977 | Kuesters et al. ..................... | 427/54 |
| 4,071,424 | 1/1978 | Dart et al. ...................... | 204/159.15 |
| 4,134,813 | 1/1979 | Kuesters et al. ............... | 204/159.24 |
| 4,250,248 | 2/1981 | Faust .................................... | 430/284 |
| 4,399,211 | 8/1983 | Kondo et al. ....................... | 430/269 |
| 4,458,007 | 7/1984 | Geissler et al. ..................... | 430/284 |
| 4,495,271 | 1/1985 | Geissler et al. ..................... | 430/284 |
| 4,657,942 | 4/1987 | Iwasaki et al. ........................ | 522/16 |
| 4,766,055 | 8/1988 | Kawabata et al. .................. | 430/281 |
| 4,772,538 | 9/1988 | Walls et al. ........................... | 430/284 |
| 4,939,069 | 7/1990 | Kawabata et al. .................. | 430/915 |

FOREIGN PATENT DOCUMENTS

| | | | |
|---|---|---|---|
| 0211615 | 2/1987 | European Pat. Off. . | |
| 262242 | 4/1988 | European Pat. Off. . | |
| 284938 | 10/1988 | European Pat. Off. ............ | 430/286 |

OTHER PUBLICATIONS

74–Radiation Chem., Photochem. Abstracts, vol. 85, 1976, p. 555, 85:54620a; Japan Kokai 75,129,214.
36–Plastics Manuf. Abstracts, vol. 86, 1977, p. 27, 86:30443q.
36–Plastics Manuf. Abstracts, vol. 95, 1981, p. 31, 95:220727u.
Patent Abstracts, J54151024 A 791127 DW 8002.

*Primary Examiner*—Marion E. McCamish
*Assistant Examiner*—Christopher D. RoDee
*Attorney, Agent, or Firm*—Foley & Lardner, Schwartz, Jeffery, Schwaab, Mack, Blumenthal & Evans

[57] ABSTRACT

A photopolymerizable mixture is described comprising (a) a polymeric binder, (b) an acrylate or alkacrylate of a polyhydric alcohol, said compound comprising at least one group which is photooxidizable on exposure to actinic radiation in the presence of a photoreducible dye, (c) a photoinitiator comprising a photoreducible benzoxanthene or benzothioxanthene dye, and (d) a second photoinitiator comprising a trihalomethyl compound capable of being cleaved by irradiation. The mixture is suitable for the production of printing plates and photoresists and displays increased photosensitivity.

29 Claims, No Drawings

PHOTOPOLYMERIZABLE COMPOSITION COMPRISING (METH)ACRYLATES WITH PHOTOOXIDIZABLE GROUPS, AND A RECORDING MATERIAL PRODUCED THEREFROM

BACKGROUND OF THE INVENTION

The present invention relates to a photopolymerizable mixture which contains a polymeric binder, a polymerizable compound having at least two acrylate or alkacrylate groups in the molecule, and a photoinitiator combination.

Photopolymerizable mixtures which contain acrylates and/or methacrylates as polymerizable compounds are known. For the production of photoresist materials, in particular of dry photoresist layers, mixtures are preferred which contain acrylates or methacrylates having urethane groups in the molecule and which can be developed using aqueous-alkaline solutions. Such mixtures are described, for example, in DE-A 2,822,190, DE-B 2,115,373, DE-C 2,361,041 and U.S. Pat. No. 3,850,770 and U.S. Pat. No. 3,960,572.

On the other hand, photopolymerizable mixtures are also known which, in order to increase the photosensitivity, contain certain combinations of photoinitiators and activators, for example carbonyl group-containing initiators and tertiary amines. Such mixtures with a synergistic effect are described, for example, in DE-A 2,602,419 and 2,251,048 and U.S. Pat. No. 3,759,807. A disadvantage of these mixtures, which contain low molecular-weight amines, is that they have a short shelf life since the amines can easily bleed out, in particular from thin coatings.

In JP-A 50/129,214, registered on 2nd Apr. 1974 under the number 49/36,614, a photopolymerizable mixture is described which contains a tetra(meth)acrylate of a N,N,N',N'-tetrahydroxyalkylalkylenediamine as the polymerizable compound. The tetrafunctional compound serves as a crosslinking agent.

Mixtures are also known which contain triethanolamine trimethacrylate as crosslinking agent; they are described for example, in Chem. Abstr. 86 /1977, 30443q and 95 (1981), 220 727n (sic.) These compounds also tend to diffuse and evaporate out of the coating on relatively long storage and at elevated ambient temperatures.

It is furthermore known that the free-radical polymerization of ethylenically unsaturated compounds can be initiated by irradiation with visible light in the presence of photoreducible dyes and reducing agents, for example amines (U.S. Pat. No. 3,097,096). However, these initiator combinations are essentially employed only in aqueous solution or in combination with water-soluble binders.

Initiator combinations of photoreducible dyes and other reducing agents are described in U.S. Pat. Nos. 3,597,343 and 3,488,269. Photopolymerizable mixtures which exclusively contain photoreducible dyes as initiators have hitherto not been employed in practice due to their inadequate photosensitivity.

In JP-A 54/151,024, a photopolymerizable mixture is described which contains an initiator combination of a merocyanine dye and a trihalomethyl-substituted s-triazine and is sensitive towards visible light, for example an argon laser. However, the sensitivity of these mixtures towards visible laser light is inadequate for economic utilization.

From EP-A 211,615, a photopolymerizable mixture is known which contains an initiator combination comprising, inter alia, a xanthene or thioxanthene dye, 2,4,6-tris-trichloromethyl-s-triazine and a peroxide and which is sensitive towards visible light. The disadvantage of this mixture lies in its content of peroxide which is sensitive to shocks and blows and to heat.

SUMMARY OF THE INVENTION

Accordingly, it is an object of the present invention to provide an improved photopolymerizable mixture.

Another object of the present invention is to provide a photopolymerizable mixture suitable for the production of printing plates for long runs.

A further object of the present invention is to provide a photopolymerizable mixture suitable for the production of photoresists having high resistance in the hardened state to processing solutions.

Additionally, it is an object of the present invention to provide a photopolymerizable mixture which is highly sensitive in the near-ultraviolet and visible spectral regions.

Yet another object of the present invention is to provide a photopolymerizable mixture which is suitable for laser beam recording in the visible spectral region.

In accomplishing the foregoing objectives, there has been provided, in accordance with one aspect of the present invention, a photopolymerizable composition comprising (a) a polymeric binder, (b) an acrylate or alkacrylate of a polyhydric alcohol, said compound comprising at least one group which is photooxidizable on exposure to actinic radiation in the presence of a photoreducible dye, (c) a photoinitiator comprising a photoreducible benzoxanthene or benzothioxanthene dye, and (d) a second photoinitiator comprising a trihalomethyl compound capable of being cleaved by irradiation. In a preferred embodiment, the acrylate or alkacrylate (b) corresponds to the formula (I).

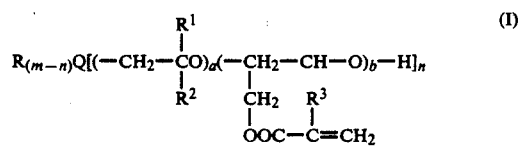

in which
Q denotes

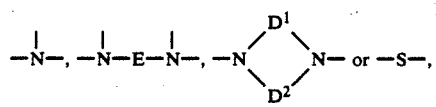

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group, '$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 ring members and comprising from zero to two N, O or S atoms as ring members, an arylene group having 6 to 12 carbon atoms, a heterocyclic aromatic group having 5 to 6 ring members or a group of the formula II

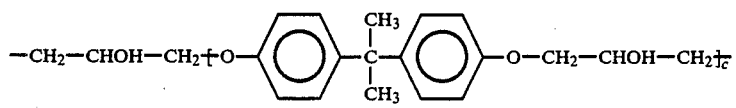

a denotes zero or an integer from 1 to 4,
b denotes an integer from 1 to 4,
c denotes an integer from 1 to 3,
m denotes 2, 3 or 4, depending on the valency of Q, and
n denotes an integer from 1 to m,
where all radicals of the same definition may be identical to or different from one another.

In another preferred embodiment, the acrylate or alkacrylate (b) corresponds to the formula (III)

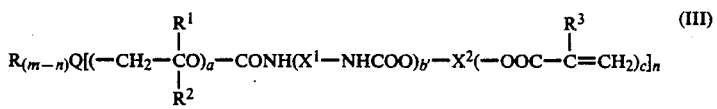

in which
Q, R, $R^1$, $R^2$, $R^3$, $D^1$, $D^2$, E, a, c, m and n have the meanings indicated for formula I above,
$X^1$ denotes a saturated hydrocarbon group having 2 to 12 carbon atoms,
$X^2$ denotes a (c+1)-valent saturated hydrocarbon group in which up to 5 methylene groups may be replaced by oxygen atoms, and
b' denotes 0 or 1,
it being possible for all radicals of the same definition to be identical to or different from one another.

In accordance with another aspect of the present invention there are provided photopolymerizable recording materials comprising a support and a layer comprising one of the described photopolymerizable compositions.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

Suitable photooxidizable groups are, in particular, amino groups, thio groups, which can also be components of heterocyclic rings, enol groups and carboxyl groups in combination with olefinic double bonds. Examples of such groups are triethanolamino, triphenylamino, thiourea, imidazole, oxazole, thiazole, acetylacetonyl, N-phenyl-glycine and ascorbic acid groups. Polymerizable compounds containing primary, secondary and, in particular, tertiary amino groups are preferred. The compounds may furthermore contain one or several urethane groups.

The compounds of formula (I) and their preparation and use are described in detail in U.S. patent application Ser. No. 270,351, (corresponding to the earlier German Patent Application No. P 3,738,864.9), which is hereby incorporated by reference.

U.S. patent application Ser. No. 07/287,279 (corresponding to German Patent Application No. P 3,743,455.1), filed simultaneously herewith, describes photopolymerizable compositions which contain initiator systems comprising these polymerizable compounds in combination with photoreducible dyes and trihalomethyl compounds that are cleavable by irradiation.

In the further U.S. patent application Ser. No. 07/287,278 (corresponding to German Application No. P 3,743,454.3), which was also filed simultaneously herewith, photopolymerizable compositions are described which comprise these polymerizable compounds in combination with certain photoreducible dyes, trihalomethyl compounds which can be cleaved by irradiation, and acridine, phenazine or quinoxaline compounds as photoinitiator systems.

The compounds of formula (III), and their preparation and use are described in U.S. patent application Ser. No. 173,936, (corresponding to the earlier German Patent Application No. P 3,710,279.6), which hereby incorporated by reference.

In the U.S. patent application Ser. No. 173,559 (corresponding to German Patent Application No. P 3,710,281.8), photopolymerizable compositions are described which comprise these polymerizable compounds in combination with certain photoreducible dyes, trihalomethyl compounds which can be cleaved by irradiation and acridine, phenazine or quinoxaline compounds as photoinitiator systems. The photoreducible dyes described therein comprise xanthene, thiazine, pyronime, porphyrine and acridine dyes, which mostly are present in the salt form.

Where, in the compounds of the general formulae I and III, more than one R radical or more than one radical of the type mentioned in square parentheses is bound to the central group Q, these radicals may be different from one another.

Compounds in which all substituents of Q are polymerizable radicals, i.e., in which m=n, are generally preferred.

In general, a=0 in not more than one radical; and preferably, a=1.

If R is an alkyl or hydroxyalkyl group, it generally has 2 to 8, preferably 2 to 4, carbon atoms. The aryl radical R can generally be mononuclear or dinuclear, preferably mononuclear, and optionally substituted by alkyl or alkoxy groups having up to 5 carbon atoms or halogen atoms.

If $R^1$ and $R^2$ are alkyl or alkoxyalkyl groups, they can contain 1 to 5 carbon atoms.

$R^3$ is preferably a hydrogen atom or a methyl group, in particular a methyl group.

$D^1$ and $D^2$ may be identical or different and, together with the two nitrogen atoms, form a saturated heterocyclic ring having 5 to 10, preferably 6, ring members.

If E is an alkylene group, it preferably has 2 to 6 carbon atoms, and as an arylene group it is preferably a phenylene group. As cycloaliphatic groups, cyclohexylene groups are preferred, and as aromatic heterocyclic rings, those containing N or S as heteroatoms and having 5 or 6 ring members are preferred.

$X^1$ is preferably a straight-chain or branched aliphatic or cycloaliphatic radical preferably having 4 to 10 carbon atoms.

$X^2$ preferably has 2 to 15 carbon atoms, of which up to 5 may be replaced by oxygen atoms. If these are pure carbon chains, those having 2 to 12, preferably 2 to 6, carbon atoms are generally employed $X^2$ can also be a cycloaliphatic group having 5 to 10 carbon atoms, in particular a cyclohexyl group.

The value of c is preferably 1.

The polymerizable compounds of the formula I where Q=N and n=m are prepared by reacting glycidyl acrylate or glycidyl alkacrylate with hydroxyalkylamines in a known manner, in the presence of a basic catalyst, such as sodium or sodium hydride, The reaction can be carried out analogously to the reaction, described in DE-A 2,927,933 or DE-B 1,800,462, of glycidyl(meth)acrylate with alcohols.

The hydroxyalkylamines used as starting materials are known or can be prepared analogously to known compounds. Examples are compounds which are produced by an addition reaction of ethylene oxide or higher alkylene oxides with ammonia or amines; for example triethanolamine, N-alkyl-N,N-di(hydroxyalkyl)amines, diethanolamine, tris-(2-hydroxypropyl)amine or tris-(2-hydroxybutyl)amine.

The polymerizable compounds of the formula III where Q=N and n=m and which contain two urethane groups in each radical (b'32 1) are prepared by reacting acrylates or alkacrylates which contain free hydroxyl groups in a known fashion with the same number of moles of diisocyanates, and reacting the excess isocyanate groups with hydroxyalkylamines. When a=0, a urea group is produced.

The polymerizable compounds of the formula III where b'=0 are prepared by reacting the above-described hydroxyalkylamines with isocyanate group-containing acrylates or alkacrylates. The isocyanate group containing ester employed is, in particular, isocyanatoethyl (meth)acrylate The polymerizable compounds of the formulae I and III where

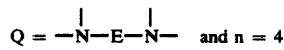  and n = 4 are prepared analogously to the polymerizable compounds where Q=N. The tetrahydroxyalkylalkylenediamines used as starting materials are known or can be prepared analogously to known compounds. Examples are compounds which are produced by an addition reaction of ethylene oxide or higher alkylene oxides with diamino compounds, for example with ethylenediamine and other alkylenediamines having up to 12, preferably up to 6, carbon atoms in the alkylene radical, p-phenylenediamine, benzidine, diaminopyridines, diaminopyrimidines and diaminopurines.

The polymerizable compounds of the formulae I and III where

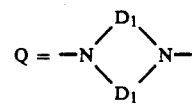

are prepared analogously to the above-described polymerizable compounds. The N-hydroxyalkylheterocyclic compounds used as starting materials are known or can be prepared analogously to known compounds. Examples are reaction products of ethylene oxide with piperazine, 1,4-diazacycloheptane or 1,10-diaza-4,7,13,16-tetraoxacyclooctadecane. In particular piperazine is employed since it is the simplest representative of this group of compounds.

The reaction of the isocyanates with the OH group containing amines and alkylacrylates and the reaction of the glycidyl acrylates or alkacrylates with the OH group-containing amines are expediently carried out in an inert solvent such as toluene or methyl ethyl ketone. In order to thermally stabilize the products, which have a great tendency towards polymerization, quinones, preferably benzoquinone, are added in concentrations of 0.01-2% by weight.

The compounds where Q=S are prepared analogously to the general procedures given above, starting from the appropriate bis-hydroxyalkyl sulfide.

Besides other components, the above-described polymerizable compounds are responsible for the very high photosensitivity of the photopolymerizable mixtures.

In addition to the photooxidizable polymerizable compounds described, conventional polymerizable compounds which contain two or more polymerizable acrylate or methacrylate groups can also be added. Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols. The products of the reaction of diisocyanates with partial esters of polyhydric alcohols can also be employed with advantage. Such monomers are described in DE-A 2,064,079, 2,361,041 and 2,822,190.

The proportion of monomers in the mixture is generally about 10 to 80, preferably 20 to 60, % by weight.

The mixture according to the invention contains a photoreducible dye as photoinitiator component. Suitable dyes are benzoxanthene or benzothioxanthene dyes.

Preferred representatives of xanthene dyes are compounds of the general formula IV

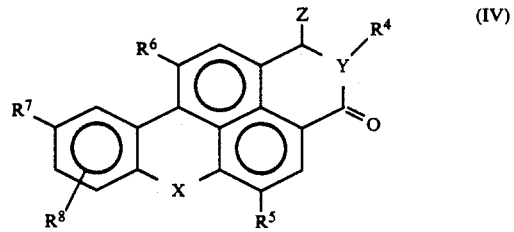

in which
- $R^4$ denotes a substituted or unsubstituted alkyl, hydroxyalkyl, dialkylaminoalkyl or aryl radical,
- $R^5$ and $R^6$ each denote hydrogen or halogen atoms or substituted or unsubstituted alkoxy radicals,
- $R^7$ and $R^8$ each denote hydrogen or halogen atoms or nitrile, alkyl, alkoxy, aryl or alkoxycarbonyl radicals,
- X denotes an oxygen or sulfur atom, and either
- Y denotes a carbon atom, and
- Z denotes a hydroxy group or an optionally substituted alkyl, alkoxy or acyloxy radical, with a double bond existing between Y and the carbon atoms by which Y and Z are linked, or
- Y denotes a nitrogen atom, and
- Z denotes a carbonyl oxygen atom, with a single bond existing between Y and the carbon atom by which Y and Z are linked.

Dyes where Y=C and their preparation are described in DE-A 2,025,291. The corresponding compounds where Y=N are prepared analogously from the starting materials named therein.

When the radicals $R^4$, $R^5$ and $R^6$ carry substituents, these preferably are halogen atoms, alkyl, alkoxy, acyl or acyloxy groups having 1 to 4 carbon atoms.

When the radicals $R^4$, $R^5$, $R^6$, $R^7$ and $R^8$ are or contain alkyl groups, these preferably have 1 to 10, in particular, 1 to 5, carbon atoms.

Chlorine or bromine are preferably employed as halogen atoms.

Suitable aryl radicals generally are those having up to three nuclei, preference being given to phenyl radicals. Acyl radicals preferably are alkanoyl radicals.

The amount of component (c) in the mixture is generally between about 0.01 and 10, preferably between about 0.05 and 4% by weight, relative to the nonvolatile components of the mixture.

In order to increase the photosensitivity, the mixtures according to the invention contain compounds having trihalomethyl groups (d) which can be cleaved photolytically and which are known per se as free-radical forming photoinitiators for photopolymerizable mixtures. As such coinitiators, compounds containing chlorine and bromine, in particular chlorine, as halogens have proven particularly successful. The trihalomethyl groups can be bound directly to an aromatic carbocyclic or heterocyclic ring or via a conjugated chain. Preferred compounds are those containing a triazine ring in the basic structure, which preferably carries two trihalomethyl groups, in particular those which are described in EP-A 137,452, DE-A 2,718,259 and DE-A 2,243,621. These compounds exhibit strong light absorption in the near UV region, at about 350–400 nm. Coinitiators are also suitable which absorb only little, or not at all in the spectral region of the copying light such as trihalomethyltriazines which contain substituents having relatively short mesomerism-capable electron systems or aliphatic substituents. Compounds having another basic structure and which absorb in the shorter-wave UV region, such as phenyl trihalomethyl sulfones or phenyl trihalomethyl ketones, for example phenyl tribromomethyl sulfone, are also suitable. The carbonylmethylene heterocyclic compounds described in DE-A 3,333,450, which contain trihalomethyl groups, are also suitable.

The components (d) are generally employed in an amount from about 0.01 to 10, preferably from about 0.05 to 6% by weight, relative to the nonvolatile components of the mixture.

The mixtures according to the invention preferably contain an acridine, phenazine or quinoxaline compound as a further initiator component (e). These compounds are known as photoinitiators and are described in DE-C 2,027,467 and 2,039,861. Due to these compounds, the sensitivity of the mixture is increased, above all in the near ultraviolet region. Suitable representatives of this class of compounds are described in the DE-C mentioned. Examples are 9-substituted acridines, such as 9-phenyl-, 9-p-methoxyphenyl- or 9-acetylaminoacridine, or acridine derivatives containing fused aromatic nuclei, for example benz(a)acridine. A suitable phenazine derivative is, for example, 9,10-dimethylbenz(a)phenazine.

Suitable quinoxaline derivatives are, in particular, the 2,3-diphenyl derivatives which are preferably further substituted in the two phenyl radicals by methoxy groups. In general, the acridine derivatives are preferred as components (e).

The amount of the optionally added component (e) in the mixture is likewise in the range of about 0.01 to 10% by weight, preferably between about 0.05 and 5% by weight.

The total amount of polymerization initiators (c), (d) and (e) is generally about 0.05 to 20, preferably about 0.1 to 10% by weight. The molar ratio of components (c), (d) and (e) to one another is preferably in the following ranges $(c):(d):(e) = 1:(0.1 \text{ to } 5):(0 \text{ to } 4)$.

Binders which can be employed include a large number of soluble organic polymers. Examples which may be mentioned are: polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers listed. Also suitable are block copolymers of vinyl aromatic compounds, such as styrene, and dienes, such as butadiene and isoprene.

Binders which are insoluble in water but soluble, or at least swellable, in aqueous-alkaline solutions are used with particular advantage since layers containing such binders can be developed using the preferred aqueous-alkaline developers. Such binders can contain, for example, the following groups: —COOH, —PO$_3$H$_2$, —SO$_3$H; —SO$_2$NH—, —SO$_2$—NH—SO$_2$— and —SO$_2$—NH—CO—.

Examples of these which may be mentioned are: maleic resins, polymers made from β-(methacryloyloxy)-ethyl N-(p-tolylsulfonyl)-carbamate, and copolymers of these and similar monomers with other monomers, and also vinyl acetate/crotonic acid copolymers and styrene/maleic anhydride copolymers. Alkyl methacrylate/methacrylic acid copolymers and copolymers made from methacrylic acid, higher alkyl methacrylates and methyl methacrylate and/or styrene, acrylonitrile and the like, as described in DE-A 2,064,080 and 2,363,806, are preferred.

The amount of binder is generally about 20 to 90, preferably about 30 to 80% by weight, of the components of the coating.

Depending on the planned use and depending on the desired properties, the photopolymerizable mixtures can contain a wide variety of substances as additives. Examples are: inhibitors for preventing thermal polymerization of the monomers, hydrogen donors, dyes, colored and colorless pigments, color formers, indicators, plasticizers and chain-transfer agents, and substances by which the sensitivity to light of the mixtures is controlled, such as certain chalcone or coumarin derivatives.

These components are expediently selected so that they absorb as little as possible in the actinic radiation region which is important for the initiation process.

In the context of this description, actinic radiation should be understood as any radiation whose energy corresponds at least to that of short-wave visible light. Above all suitable is visible light and longwave UV radiation, but also short-wave UV radiation, laser radiation, electron radiation and X-ray radiation.

The photopolymerizable mixture can be used for a very wide variety of applications, for example for the production of paints which are hardened by light, as dental fillings or tooth replacement material and, in particular, as photosensitive recording material in the reproduction field. Possible applications in this field which may be mentioned are: recording layers for photomechanical production of printing forms for letterpress printing, flexoprinting, planographic printing, rotogravure printing, screen printing, of relief copies, for example the production of braille texts, of individual copies, tanned images, pigmented images etc. In addition the mixtures can be used for photomechanical production of etch resists, for example for the production of nameplates, of copied circuits and for chemical milling. The mixtures according to the invention have particular importance as copying layers for the production of printing plates and for the photoresist technique.

The commercial utilization of the mixture for the applications mentioned can take place in the form of a liquid solution or dispersion, for example as a photoresist solution which is applied by the consumer himself to an individual support, for example for chemical milling, for the production of copied circuits, of screen-printing stencils and the like. The mixture can also be present as a solid, photosensitive coating on a suitable support in the form of a storable, presensitized, photosensitive copying material, for example for the production of printing plates. It is likewise suitable for the production of dry resist materials.

It is generally favorable to keep the mixture away from the influence of atmospheric oxygen during the photopolymerization. When the mixture is used in the form of thin copying layers, it is advisable to apply a suitable protective film which is impermeable to oxygen. This can be self-supporting and removed before development of the copying layer. For this purpose, polyester films, for example, are suitable. The protective film can also comprise a material which dissolves in the developer liquid or can at least be removed from the non-hardened areas during development. Materials which are suitable for this purpose are, for example, waxes, polyvinyl alcohol, polyamides, polyphosphates, sugars, etc. Such protective layers generally have a thickness of 0.1 to 10, preferably 1 to 5, $\mu$m.

Suitable layer supports for copying materials produced using the mixture according to the invention are, for example, aluminum, steel, zinc, copper and plastic films, for example made from polyethylene terephthalate or cellulose acetate, and also supports for screen-printing stencils, such as Perlon gauze. In many cases, it is favorable to subject the support surface to a pre-treatment (chemical or mechanical), the aim of which is to set the adhesion of the layer correctly, to improve the lithographic properties of the support surface or to reduce the reflectivity of the support in the actinic range of the copying layer (anti-halation treatment).

The production of the light-sensitive materials using the mixture according to the invention takes place in a known fashion. Thus, this mixture can be taken up in a solvent, and the solution or dispersion can then be applied to the intended support by pouring, spraying, dipping, roll application, etc., and subsequently dried. Thick layers (e.g., of 250 $\mu$m and more) are advantageously produced by extrusion or press molding as a selfsupporting film, the latter then being laminated, if desired, onto the support. In the case of dry resists, solutions of the mixture are applied to transparent supports and dried. The photosensitive layers, having thickness between about 10 and 100 $\mu$m, are then likewise laminated onto the desired final support together with the temporary support.

Due to the broad spectral sensitivity of the mixture according to the invention, all light sources known to those skilled in the art can be used, for example tubular lamps, xenon pulsed lamps, metal halide-doped mercury vapor high-pressure lamps and carbon arc lamps. In addition, exposure in conventional projectors and enlargers under the light of metal filament lamps, and contact exposure using conventional incandescent bulbs are possible in the case of the photosensitive mixtures according to the invention. Exposure can also take place using coherent light from a laser. Suitable for the purpose of the present invention are lasers of appropriate power, for example argon ion, krypton ion, dye, helium/cadmium and helium/neon lasers, which emit, in particular, between about 250 and 650 nm. The laser beam can be controlled by means of a prespecified programmed line and/or dot movement.

The further processing of the materials is carried out in a known fashion. For better crosslinking of the layers, post-heating after exposure can take place. For development, they are treated with a suitable developer solution, for example with organic solvents, but preferably with a slightly alkaline aqueous solution, the unexposed parts of the layers being removed and the exposed areas of the copying layer remaining on the support.

Illustrative embodiments of the invention are given below. Firstly, a number of polymerizable compounds of general formulae I and III, which are employed in the Examples, are listed in Tables I and II below.

These compounds are produced by one of the processes given above. The compounds are employed as polymerizable compounds in the examples below in recording materials according to the invention. In the examples, parts by weight (PW) and parts by volume (PV) are in the ratio g to ccm. Percentage and weight ratios are taken to mean weight units, unless otherwise stated.

TABLE I

Compounds of the general formula I, with $R^2$ = H; $R^3$ = CH$_3$; m = n; a = 1;

| Comp. No. | Q | $R^1$ | m |
|---|---|---|---|
| 1 | —N— | H | 3 |
| 2 | —N—CH$_2$—CH$_2$—N— | CH$_3$ | 4 |
| 3 | —S— | H | 2 |
| 4 | * | H | 4 |

$$*-N-CH_2-CHOH-CH_2-O-\underset{CH_3}{\underset{|}{\overset{CH_3}{\overset{|}{C}}}}(C_6H_4)_2-O-CH_2-CHOH-CH_2-N-$$

TABLE II

Compounds of the general formula III, with
$R^2$ = H; $R^3$ = CH$_3$; $X^2$ = C$_2$H$_4$; m = n; a = 1

| Compound | Q | $R^1$ | $X^1$ | b | m |
|---|---|---|---|---|---|
| 5 | —N— | H | Hexamethylene | 1 | 3 |
| 6 | —N—CH$_2$—CH$_2$—N— | CH$_3$ | — | 0 | 4 |
| 7 | —N— | H | — | 0 | 3 |

EXAMPLES 1 to 10

Electrochemically grained and anodically oxidized aluminum which had an oxide layer of 3 g/m$^2$ and which had been pre-treated with an aqueous solution of polyvinylphosphonic acid was used as layer support material for printing plates. The supports were coated with solutions of the following composition:

- 2.87 PW of a 34.8% strength solution in butanone, of a copolymer made from methylmethacrylate and methacrylic acid and having an acid number of 110 and an average molecular weight of 35,000,
- 1.00 PW of compound 1, and
- 0.03 PW of 2,4-bis-trichloromethyl-6-(4-styrylphenyl)-s-triazine, in
- 22.00 PW of propylene glycol monomethyl ether.

To each coating solution, a dye corresponding to the general formula IV was added in the amount specified in Table III. Application took place by spin-coating in a fashion such that a dry weight of 1.8 to 2 g/m$^2$ was obtained. The plates were subsequently dried for 2 minutes at 100° C. in a fan-assisted drying cabinet. The plates were then coated with a 15% strength aqueous solution of polyvinyl alcohol (12% of residual acetyl groups, K value 4). After drying, protective layers having a weight of 4 to 5 g/m$^2$ were obtained. The printing plates obtained were exposed using a 5 kW metal halide lamp at a distance of 110 cm under a 13-step exposure wedge containing density increments of 0.15 and on which, where specified, a silver film of uniform optical density (density 1.57) and uniform absorption over the effective spectral range was additionally mounted as neutral density filter. In order to test the sensitivity of the printing plates in visible light, 3 mm thick sharp cut-off filters from Messrs. Schott having the cut-off transmissions given in the table were mounted in each case on the exposure wedge. After exposure, the plates were heated to 100° C. for one minute. They were subsequently developed in a developer of the following composition:

- 8.5 PW of sodium metasilicate × 9 H$_2$O,
- 0.8 PW of NaOH,
- 1.5 PW of Na$_2$B$_4$O$_7$ × 10 H$_2$O,
- 89.2 PW of demineralized water.

The plates were inked with a greasy printing ink. The numbers of fully crosslinked wedge steps which were obtained are indicated in Table III.

When samples of the protective layers were peeled off from the photosensitive layers after a storage of 1 hour at 100° C., no coloring of the protective films due to diffusion of the dyes employed was stated.

TABLE III

| Example No. | Dye according to formula I, with $R^5$ = $R^6$ = $R^8$ = H | | Amount (g) | Exposure time (s) | Neutral density filter | Sharp cut-off filter | Wedge steps |
|---|---|---|---|---|---|---|---|
| 1-8 | $R^7$ = OCH$_3$; X = O; Y = C | | | | | | |
| | $R^4$ | Z | | | | | |
| 1 | 4-C$_6$H$_4$OH | OH | 0.02 | 20 | yes | — | 5 |
| | | | | 20 | no | 455 | 4 |
| 2 | C$_6$H$_5$ | CH$_3$COO | 0.02 | 20 | yes | — | 4 |
| | | | | 20 | no | 455 | 4 |
| 3 | 4-CH$_3$COOC$_6$H$_4$ | CH$_3$COO | 0.02 | 20 | yes | — | 7 |
| | | | | 20 | no | 455 | 4 |
| 4 | C$_6$H$_5$ | C$_2$H$_5$O | 0.02 | 20 | yes | — | 5 |
| | | | | 20 | no | 455 | 3 |
| 5 | 4-C$_2$H$_5$OC$_6$H$_4$ | C$_2$H$_5$O | 0.02 | 20 | yes | — | 5 |
| | | | | 20 | no | 455 | 4 |
| 6 | C$_6$H$_5$ | n-C$_4$H$_9$O(C$_2$H$_4$O)$_2$ | 0.02 | 20 | yes | — | 8 |
| | | | | 20 | no | 455 | 10 |
| 7 | 4-n-C$_4$H$_9$O(C$_2$H$_4$O)$_2$C$_6$H$_4$ | n-C$_4$H$_9$O(C$_2$H$_4$O)$_2$ | 0.02 | 20 | yes | — | 6 |
| | | | | 20 | no | 455 | 5 |

TABLE III-continued

| Example No. | Dye according to formula I, with $R^5 = R^6 = R^8 = H$ | | Amount (g) | Exposure time (s) | Neutral density filter | Sharp cut-off filter | Wedge steps |
|---|---|---|---|---|---|---|---|
| 8 | $C_6H_5$ | OH | 0.02 | 20 | yes | — | 7 |
|   |   |   |   | 20 | no | 455 | 9 |
| 9 | X=S; Y=C; $R^7$=H; $R^4$=$C_6H_5$; Z=$CH_3COO$ | | 0.06 | 1 | yes | — | 1 |
|   |   |   |   | 1 | no | 455 | 3 |
| 10 | X=O; Y=N; Z=O; $R^7$=$OCH_3$ $R^4$=$HO(CH_2)_5$ | | 0.02 | 20 | yes | — | 7 |
|   |   |   |   | 20 | no | 455 | 7 |

EXAMPLE 11

A solution of the following composition was spin-coated onto the layer support material specified in Examples 1 to 10 under the same conditions as in Examples 1 to 10 so that a layer weight of 2.0 g/m² was obtained:
2.84 PW of the copolymer solution given in Examples 1–10,
1.0 PW of compound 1,
0.06 PW of dye,
0.03 PW of the s-triazine given in Examples 1–10, and
0.04 PW of 9-phenylacridine in
22.0 PW of propylene glycol monomethyl ether.

The dye employed was a compound corresponding to formula IV, with X=S; Y=C; Z=$CH_3O$; $R^4$=phenyl; and $R^5$=$R^6$=$R^7$=$R^8$=H.

After application of a protective coating of polyvinyl alcohol, the plate was exposed and developed in the same way as in Examples 1–10. Another plate was prepared in the same way, but without the addition of phenylacridine. The following numbers of fully crosslinked wedge steps were obtained:

| Exposure time (s) | Neutral density filter | Sharp cut-off filter | Wedge steps with phenylacridine | steps without phenylacridine |
|---|---|---|---|---|
| 5 | yes | — | 4 | 2 |
| 5 | no | 455 | 9 | 7 |

EXAMPLE 12

A solution of the following composition was spin-coated onto the layer support specified in Examples 1–10 so that a layer weight of 2.5 g/m² was obtained:
2.87 PW of the copolymer solution given in Examples 1–10,
1.0 PW of compound 1,
0.06 PW of the dye of Example 11, and
0.03 PW of halo compound, in
20.0 PW of propylene glycol monomethyl ether.

The plates were processed in the same way as in Examples 1–10. After an exposure time of 20 seconds, the following numbers of fully crosslinked wedged steps were obtained:

| Halo Compound | Neutral density filter | Sharp cut-off filter | Wedge step |
|---|---|---|---|
| 2-(4-Trichloromethyl-benzoylmethylene-3-ethylbenzothiazoline | yes | — | 4 |
|  | no | 455 | 7 |
| Phenyl tribromomethyl sulfone | yes | — | 3 |
|  | no | 455 | 9 |

EXAMPLE 13

The layer support material specified in Examples 1–10 was coated with solutions of the following compositions so that layer weights of 2.0 g/m² were obtained:
2.29 PW of a 30.05% strength solution, in methylethyl ketone, of a terpolymer obtained from styrene, n-hexylmethacrylate and methacrylic acid (10:60:30) and having an acid number of 190,
1.00 PW of one of the monomers listed in Table IV,
0.06 PW of the dye specified in Example 11, and
0.03 PW of 2,4-bis-trichloromethyl-6-(4-styryl-phenyl)-s-triazine, in
22.00 PW of propylene glycol monomethyl ether.

The plates were processed as described in Examples 1–10. The numbers of fully crosslinked wedge steps obtained are given in Table IV below.

TABLE IV

| Compound No. | Exposure time (s) | Neutral density filter | Sharp cut-off filter | Wedge steps |
|---|---|---|---|---|
| 1 | 10 | yes | — | 4 |
|   | 10 | no | 455 | 9 |
| 2 | 5 | yes | — | 2 |
|   | 5 | no | 455 | 7 |
| 3 | 20 | yes | — | 3 |
|   | 20 | no | 455 | 6 |
| 4 | 20 | yes | — | 4 |
|   | 20 | no | 455 | 9 |
| 5 | 20 | yes | — | 3 |
|   | 20 | no | 455 | 8 |
| 6 | 20 | yes | — | 1 |
|   | 20 | no | 455 | 4 |
| 7 | 10 | yes | — | 3 |
|   | 10 | no | 455 | 7 |

In order to demonstrate that the combination according to this invention is more suitable for practical applications than the combined disclosed in EP-A 211,615, the support material specified in Examples 1–10 was coated with the following solution, as specified in EP-A 211,615, so that a layer weight of 1.8 to 2.0 g/m² was obtained:
2.87 PW of the copolymer solution specified in Examples 1–10,
1.0 PW of pentaerythritol triacrylate,
0.06 PW of the dye specified in Example 11,
0.03 PW of N-phenylglycine,
0.06 PW of 2,5-dimethylpentane-2,5-bis-tert -butyl peroxide,
20.00 PW of butanone
3.75 PW of propylene glycol monomethyl ether.

The coated plate was processed as described in EP-A 211,615. No completely hardened wedge step was obtained after exposure for 10 seconds through a neutral density filter and through a sharp cut-off filter and development with the developer specified in Examples 1–10.

EXAMPLE 14

The printing plate of Example 9, but containing a dye of the general formula IV with X=S; Y=C; Z=CH$_3$COO; R$^4$=C$_6$H$_5$; R$^5$=R$^6$=R$^7$=R$^8$=H, was exposed using the expanded beam of an argon-ion laser and further processed as in Examples 1-10.

The exposure results are shown below:

| Wavelength (nm) | Energy in the laser beam (mW/cm$^2$) | Exposure time (seconds) |
| --- | --- | --- |
| 488.0 | 0.225 | 20 |

Printing tests carried out using this plate gave over 100,000 perfect prints.

EXAMPLE 15

A solution of the following composition was spin-coated onto the support material specified in Examples 1-10 so that a layer weight of 2.0 g/m$^2$ was obtained:
 2.29 PW of the terpolymer solution given in Example 13,
 0.5 PW of compound 1,
 1.31 pW of a 51.2% strength solution of the product obtained by reacting 1 mole of 2,2,4-trimethylhexamethylene diisocyanate with 2 moles o f hydroxyethyl methacrylate, in butanone,
 0.06 PW of the dye of Example 11, and
 0.03 PW o f 2,4-bis-trichloromethyl-6- (4-styrylphenyl)-s-triazine, in
 22.00 PW of propylene glycol monomethyl ether.

The plate was processed in the same was as in Examples 1-10. After exposure for 20 seconds, the following numbers of fully crosslinked wedge steps were obtained:

| Neutral density filter | Sharp cut-off filter | Steps |
| --- | --- | --- |
| yes | — | 3 |
| no | 455 | 7 |

EXAMPLE 16

Solutions of the following composition were spin-coated onto the support material specified in Examples 1-10 under the same conditions as there:
 2.87 PW of the copolymer solution specified in Examples 1-10,
 1.0 PW of compound 1,
 0.06 PW of the dye of Example 11,
 0.03 PW of 2,4-bis-trichloromethyl-6- (4-styrylphenyl)-s-triazine, and
 0.1 PW of carbonyl compound in
 22.0 PW of propylene glycol monomethyl ether.

The coated plates were dried as in Examples 1-10 and provided with a protective coating. The exposure was carried out from 400 to 700 nm using a graduated interference filter using parallel light from a 500 W incandescent bulb arranged at a distance of 55 cm. After development as in Examples 1-10, complete hardening was found in the spectral regions specified:

| carbonyl compound | Exposure time (seconds) | Spectral region (nm) |
| --- | --- | --- |
| 4-Dimethylamino-4'-methoxydibenzal acetone | 30 | 410-600 |
| 3-Acetyl-7-diethylamino-coumarine | 30 | 420-605 |

Without the carbonyl compounds, a hardened region was obtained after 30 seconds from 450-590 nm.

The effectiveness of the added compounds with respect to the resolving power was determined using a test pattern, the FOGRA-PMS wedge, and read off on the copy. The above-mentioned mixture without dibenzal acetone or courmarine derivative gave in each case a resolution which was worse by at least one step in the K field on the test pattern.

EXAMPLE 17

The coating solution from Example 4, containing compound 7, was spin-coated onto a biaxially stretched 35 μm thick polyethylene terephthalate film so that, after drying, a layer weight of 5 g/m$^2$ was obtained. The layer was post-dried for 3 minutes at 100° C. in a fan-assisted drying cabinet. The coating was subsequently laminated at 115° C. at a rate of 1.5 m/s onto a cleaned layer support comprising an insulating material with a 35 μm copper coating.

The coating was exposed for 30 seconds using a 5 kW metal halide lamp (distance 140 cm) under a sharp cut-off filter 455, as described in Example 1, and under a step wedge, post-heated at 100° C. for 1 minute, and developed for 20 seconds in a spray processor after removing the film, using 0.8% strength soda solution. Seven fully crosslinked wedge steps were obtained. The crosslinked coating was resistant to the iron(III) chloride solution which is customary in printed circuit board technology. The etching resistance was good.

What is claimed is:

1. A photopolymerizable composition comprising:
 (a) a polymeric binder,
 (b) an acrylate or alkacrylate of a polyhydric alcohol, said acrylate or alkacrylate comprising at least one group which is photooxidizable on exposure to actinic radiation in the presence of a photoreducible dye,
 (c) a photoinitiator comprising a photoreducible benzoxanthene or benzothioxanthene dye,
 (d) a second photoinitiator comprising a trihalomethyl compound capable of being cleaved by irradiation,
 and optionally (e) an acridine, phenazine, or quinoxaline compound which acts as a photoinitiator.

2. A composition as claimed in claim 1, wherein said acrylate or alkacrylate is a compound of the formula I

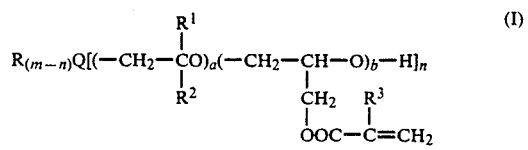

wherein
Q denotes

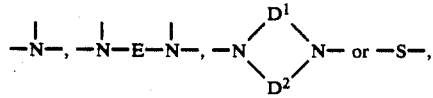

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group,
$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 ring members and comprising from zero to two N, O or S atoms as ring members, an arylene group having 6 to 12 carbon atoms, a heterocyclic aromatic group having 5 or 6 ring members or a group of the formula II $$-CH_2-CHOH-CH_2 \{ -O-\bigcirc-\underset{\underset{CH_3}{|}}{\overset{\overset{CH_3}{|}}{C}}-\bigcirc-O-CH_2-CHOH-CH_2 \}_c, \quad (II)$$

a denotes zero or an integer from 1 to 4,
b denotes an integer from 1 to 4,
c denotes an integer from 1 to 3,
m denotes 2, 3 or 4, depending on the valency of Q, and
n denotes an integer from 1 to m,
where all radicals of the same definition may be identical to or different from one another.

3. A composition as claimed in claim 2, wherein n=m.

4. A composition as claimed in claim 2, wherein E is a saturated alkylene group having 2 to 6 carbon atoms.

5. A composition as claimed in claim 2, wherein $R^3=CH_3$.

6. A composition as claimed in claim 2, wherein a=1.

7. A composition as claimed in claim 1, wherein said acrylate or alkacrylate is a compound of the formula III $$R_{(m-n)}Q[(-CH_2-\underset{\underset{R^2}{|}}{\overset{\overset{R^1}{|}}{C}}O)_a-CONH(X^1-NHCOO)_{b'}-X^2(-OOC-\underset{\underset{CH_2)_c}{}}{\overset{\overset{R^3}{|}}{C}}=CH_2)_c]_n \quad (III)$$

wherein
Q denotes $$-N-, \quad -N-E-N-, \quad -N\underset{D^2}{\overset{D^1}{<}}N- \text{ or } -S-,$$

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group,
$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 ring members and comprising from zero to two N, O or S atoms as ring members, an arylene group having 6 to 12 carbon atoms, a heterocyclic aromatic group having 5 or 6 ring members or a group of the formula II $$-CH_2-CHOH-CH_2 \{ -O-\bigcirc-\underset{\underset{CH_3}{|}}{\overset{\overset{CH_3}{|}}{C}}-\bigcirc-O-CH_2-CHOH-CH_2 \}_c, \quad (II)$$

a denotes zero or an integer from 1 to 4,
c denotes an integer from 1 to 3,
m denotes 2, 3 or 4, depending on the valency of Q, and
n denotes an integer from 1 to m,
$X^1$ denotes a saturated hydrocarbon group having 2 to 12 carbon atoms,
$X^2$ denotes a (c+1)-valent saturated hydrocarbon group in which up to 5 methylene groups may be replaced by oxygen atoms, and
b' denotes 0 or 1,
where all radicals of the same definition may be identical to or different from one another.

8. A composition as claimed in claim 7, wherein n=m.

9. A composition as claimed in claim 7, wherein E is a saturated alkylene group having 2 to 6 carbon atoms.

10. A composition as claimed in claim 7, wherein $R^3=CH_3$.

11. A composition as claimed in claim 7, wherein a=1.

12. A composition as claimed in claim 1, wherein said benzoxanthene dye or benzothioxanthene dye is a compound of the formula IVa

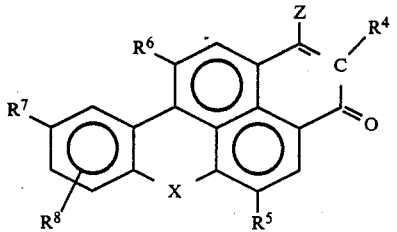

in which
R⁴ denotes a substituted or unsubstituted alkyl, hydroxyalkyl, dialkylaminoalkyl or aryl radical,
R⁵ and R⁶ denote hydrogen atoms, halogen atoms or substituted or unsubsitiuted alkoxy radicals,
R⁷ and R⁸ denote hydrogen atoms, halogen atoms or nitrile, alkyl, alkoxy, aryl or alkoxycarbonyl radicals,
X denotes an oxygen or sulfur atom, and
Z denotes a hydroxy group or a substituted or unsubstituted alkyl, alkoxy or acyloxy radical.

13. A composition as claimed in claim 1, wherein said benzoxanthene dye or benzothioxanthene dye is a compound of the formula IV b

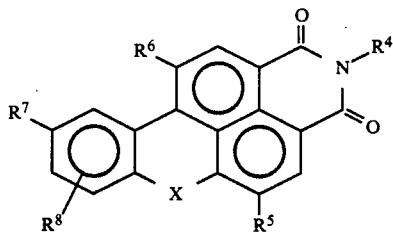

in which
R⁴ denotes a substituted or unsubstituted alkyl, hydroxylalkyl, dialkylaminoalkyl or aryl radical,
R⁵ and R⁶ denote hydrogen atoms, halogen atoms or substituted or unsubstituted alkxoy radicals,
R⁷ and R⁸ denote hydrogen atoms, halogen atoms or nitrile, alkyl, alkoxy, aryl or alkoxycarbonyl radicals, and
X denotes an oxygen or sulfer atom.

14. A composition as claimed in claim 1 comprising from about 10 to 80% by weight of said acrylate or alkacrylate.

15. A composition as claimed in claim 1 comprising from about 20 to 90% by weight of said polymeric binder.

16. A composition as claimed in claim 1 comprising from about 0.01 to 10% by weight, relative to the nonvolatile constituents of the mixture, of said photoreducible dye (c).

17. A composition as claimed in claim 1, comprising from about 0.01 to 10% by weight, relative to the nonvolatile constituents of the mixture, of said trihalomethyl compound (d).

18. A composition as claimed in claim 1, wherein said trihalomethyl compound comprises an s-triazine which is substituted by at least one trihalomethyl group and one further group, or an aryl trihalomethyl sulfone.

19. A composition as claimed in claim 18, wherein said further group comprises at least one aromatic nucleus which is connected to the triazine radical either directly or via a conjugated double bond system.

20. A composition as claimed in claim 1, wherein said binder is insoluble in water, but soluble or at least swellable in aqueous-alkaline solutions.

21. A composition as claimed in claim 1, which comprises about 10 to 80% by weight of said acrylate or alkacrylate, about 20 to 90% by weight of said polymeric binder and about 0.05 to 20% by weight, relative to the nonvolatile constituents of the mixture, of said photoinitiators (c) and (d).

22. A composition as claimed in claim 1 comprising from about 0.01 to 10% by weight, relative to the nonvolatile constituents of the mixture, of said acridine, phenazine or quinoxaline compound.

23. A composition as claimed in claim 1, wherein the molar ratio of components (c), (d), and (e) to one another is in the ranges (c):(d):(e)=1: (0.1 to 5): (0 to 4).

24. A photopolymerizable recording material comprising a layer support and a photopolymerizable layer, wherein said photopolymerizable layer comprises a composition as claimed in claim 1.

25. A photopolymerizable recording material as claimed in claim 24 further comprising an oxygen impermeable protective film.

26. A photopolymerizable recording material as claimed in claim 24, wherein said support has a surface comprising aluminum, steel, zinc or copper.

27. A photopolymerizable recording material as claimed in claim 24, wherein said support has a surface comprising a plastic film.

28. A composition as claimed in claim 1, consisting essentially of the recited ingredients.

29. A photopolymerizable recording material comprising a layer support and a photopolymerizable layer, wherein said photopolymerizable layer consists essentially of a composition as claimed in claim 28.

* * * * *

UNITED STATES PATENT AND TRADEMARK OFFICE
CERTIFICATE OF CORRECTION

PATENT NO. : 4,987,055
DATED : January 22, 1991
INVENTOR(S) : RODE et al

It is certified that error appears in the above-identified patent and that said Letters Patent is hereby corrected as shown below:

Title Page:

Please correct the following in the heading of the patent:

"[30] Foreign Application Priority Data

Dec. 22, 1987 [DE] Fed. Rep. of Germany....3743547" to read

--[30] Foreign Application Priority Data

Dec. 22, 1987 [DE] Fed. Rep. of Germany ...3743457--.

Signed and Sealed this

Fifth Day of January, 1993

*Attest:*

DOUGLAS B. COMER

*Attesting Officer*  *Acting Commissioner of Patents and Trademarks*